United States Patent
Fenny et al.

(10) Patent No.: US 7,882,778 B2
(45) Date of Patent: Feb. 8, 2011

(54) HYDRAULIC ACTUATOR WITH FLOATING PISTONS

(75) Inventors: Carlos A. Fenny, Arlington, TX (US); Marc W. Kinard, Burleson, TX (US); John Lauffer, Santa Clarita, CA (US)

(73) Assignee: Woodward HRT, Inc., Santa Clarita, CA (US)

( * ) Notice: Subject to any disclaimer, the term of this patent is extended or adjusted under 35 U.S.C. 154(b) by 414 days.

(21) Appl. No.: 12/045,924

(22) Filed: Mar. 11, 2008

(65) Prior Publication Data

US 2009/0229694 A1 Sep. 17, 2009

(51) Int. Cl.
*F15B 15/14* (2006.01)
*B60G 17/04* (2006.01)
(52) U.S. Cl. .......................................... 91/509; 60/403
(58) Field of Classification Search .................... 91/508, 91/509, 510; 60/403, 405; 244/99.2, 99.4, 244/99.5, 99.6
See application file for complete search history.

(56) References Cited

U.S. PATENT DOCUMENTS

| | | | |
|---|---|---|---|
| 4,987,927 A | 1/1991 | Kluczynski | |
| 6,546,957 B2 | 4/2003 | Hajek, Jr. | |
| 2005/0132877 A1 | 6/2005 | Hart | |

FOREIGN PATENT DOCUMENTS

| | | | |
|---|---|---|---|
| DE | 102006028878 A1 | * | 12/2007 |
| WO | 2006088488 A2 | | 8/2006 |

OTHER PUBLICATIONS

International Search Report and Written Opinion for PCT/US2008/084845, mailed on Aug. 5, 2009.

* cited by examiner

*Primary Examiner*—Thomas E Lazo
(74) *Attorney, Agent, or Firm*—BainwoodHuang

(57) ABSTRACT

A hydraulic actuator is configured to provide redundant boost control to an aircraft within approximately the same space required by a single hydraulic cylinder. The hydraulic actuator includes a housing and a piston assembly disposed within the housing. The piston assembly includes a ram, a first piston secured to the ram, and second and third pistons disposed on the ram such that the second and third pistons are translatable relative to the longitudinal axis of the ram. The pistons form two hydraulically separate actuator cylinders within the space required by a single cylinder which results in a reduction in the weight and size of the hydraulic actuator.

19 Claims, 7 Drawing Sheets

HYDRAULIC ACTUATOR WITH FLOATING PISTONS

BACKGROUND

In fixed wing and rotary wing such as helicopters, a pilot causes the Aircraft to undergo flight maneuvers via a hydraulic actuator. Typically, the pilot input forces are multiplied or boosted that provides a relatively large mechanical advantage to the pilot when altering flight control surfaces or rotor blade pitch. For example, as the pilot provides a small amount of force (e.g., about 0.5 pounds force) on the mechanical linkages, the hydraulic boost device provides a relatively large force (e.g., 2,000-5,000 pounds force) on the flight control surface or rotor blade.

Conventional hydraulic boost devices are designed to avoid flight-critical failure modes. Typically in helicopter or aircraft systems, multiple hydraulic actuators are structurally or mechanically linked together to provide redundancy. Such redundancy allows for continued safe flight of the helicopter in the event that a portion of a hydraulic system driving a hydraulic actuator fails during operation.

FIG. 1 illustrates one type of hydraulic actuator system 10 utilized to provide dual redundancy for flight controls. As illustrated, the hydraulic actuator system 10 includes two separate hydraulic cylinders 12, 14 positioned in either a side-by-side arrangement, as shown, or may also be in an inline tandem arrangement. A dedicated control valve 16 and hydraulic system 20 controls the first hydraulic cylinder 12 while a dedicated control valve 18 and hydraulic system 22 controls the second hydraulic cylinder 14. Both the control valve and the cylinder are structurally connected and perform identical functions for dual redundancy. In use, as a pilot actuates a lever 24, the lever 24 positions a valve member 26 of the first and second control valves 16, 18 to control the flow of pressurized fluid from the hydraulic systems 20 and 22 to the hydraulic cylinders 12, 14, thereby controlling the positioning of a flight control surface via the rod end 28. In the event one of one of the hydraulic systems 20, or 22 were to develop a leak or pump failure and system pressure were lost, the remaining functioning control valve and hydraulic system provides pressurized fluid to the corresponding hydraulic cylinder to allow for continued operation. The use of a dual and independent hydraulic actuator system 10 provides for a relatively high degree of safety by allowing the pilot to control the aircraft in the event of failure of a portion of the hydraulic actuator system 10.

FIG. 2 illustrates another type of hydraulic actuator system 50 utilized to provide dual redundancy. As illustrated, the hydraulic actuator system 50 includes a single hydraulic cylinder 52 with a single control valve 54. The hydraulic actuator system 50 also includes first and second hydraulic systems 56, 58 in fluid communication with the hydraulic cylinder 52 via a switching valve 60. The switching valve 60 provides failover redundancy in the hydraulic actuator system 50. For example, the switching valve 60 is disposed in a first compressed position relative to the control valve 54, as illustrated, to allow pressurized fluid to flow between the first hydraulic system 56 and the hydraulic cylinder 52. As a pilot actuates a lever 62, the lever 62 adjusts a position of a valve member 64 of the control valve 54 to control the flow of pressurized fluid from the first hydraulic system 56 to the hydraulic cylinder 52. In turn, the hydraulic cylinder 52 controls the positioning of rod end 68. In the event that the hydraulic system 56 were to develop a failure, the switching valve 60 moves to a second, extended position via spring 70 to allow pressurized fluid to flow between the second hydraulic system 58 and the hydraulic cylinder 52. The use of the single control valve 54 in combination with the switching valve 60 provides the system 50 with a level of redundancy at a relatively low cost and low weight.

SUMMARY

Conventional hydraulic actuator systems suffer from a variety of deficiencies. For example, the hydraulic actuator system 10 of FIG. 1 increases the overall weight and cost of the system 10 since each of the hydraulic cylinders 12, 14 are duplicated and must be sized to provide the required output force with only one system operating. Accordingly, each hydraulic cylinder 12, 14 is required to produce twice the force necessary to actuate a flight control surface, such as a rotor. For example, assume an output of 2,000 pounds force is required to control a flight control surface. Each of the hydraulic cylinders 12, 14 must be sized to provide 2,000 pounds force to control actuation of the rotor and with both hydraulic systems operational, twice the required force is produced. The supporting aircraft structure and linkages thus must be designed to support twice the needed force, a total of 4,000 pounds force, and to withstand the large force output when both hydraulic cylinder 12, 14 are operational.

In another example, the hydraulic system 50 of FIG. 2 includes a single hydraulic cylinder 52 with a single control valve 54 where one of the first and second hydraulic systems 56, 58 provides pressurized fluid to the hydraulic cylinder 52 by a switching valve 60. While the use of a single hydraulic cylinder 52 and single control valve 54 reduces the weight and the costs associated with the hydraulic system 50, the use of the single switching valve 60 can reduce system safety because of the transient produced when switching from one system to another. The failure of one system, such as the first hydraulic system 56 must be sensed, confirmed and shut off and the other system, such as the second hydraulic system 58 switched in quickly to re-gain control of the flight control surface. However, the single control valve 54 does not meet current Federal Aviation Administration (FAA) requirements of an independent control valve. The FAA has deemed such a configuration as unacceptable for critical flight control applications because, in the event that the switching valve 60 was to fail during operation, the entire system could become inoperable.

By contrast to conventional hydraulic actuators found in conventional hydraulic actuator systems, embodiments of the present invention relate to a hydraulic actuator that provides redundant boost control to an aircraft within approximately the same space required by a single hydraulic cylinder. The hydraulic actuator includes a housing and a piston assembly disposed within the housing. The piston assembly includes a ram, a first piston secured to the ram, and second and third pistons disposed on the ram such that the second and third pistons are translatable relative to the longitudinal axis of the ram. The pistons form two hydraulically separate actuator cylinders. Such a configuration results in a reduction in the weight and size of the hydraulic actuator and provides fail safe redundancy in the event of failure of either hydraulic system associated with the hydraulic actuator by automatically switching between a first, non-functional hydraulic actuator and a second functional hydraulic actuator. The hydraulic actuator does not incur viscous damping losses in the event of failure of one hydraulic system when the other hydraulic system is actively operating. Accordingly, the present hydraulic actuator does not require the use of a switching valve. The configuration of the hydraulic actuator also allows the hydraulic actuator to provide only the output load required to actuate a variable-geometry element, as opposed to double the output load as required in conventional dual actuators. In other words, in use, the hydraulic actuator produces the same output force whether both hydraulic system are pressurized or only a single hydraulic system is pressurized. Accordingly, the present configuration of the hydraulic actuator allows for lighter weight aircraft structure and linkage hardware, thereby providing optimal sizing for an aircraft.

Additionally, by contrast to conventional hydraulic actuators found in conventional hydraulic actuator systems, embodiments of the present hydraulic actuator that provides redundant boost control to an aircraft without the need for thermal relief, anti-cavitation, bypass, shut-off, or return check valves as found in conventional dual actuators. Accordingly, because of the reduced complexity and reduced number of parts required to manufacture the present hydraulic actuator, the present hydraulic actuator costs a manufacturer less to produce.

In one arrangement, a hydraulic actuator includes an elongate shaft and a housing defining a housing chamber at least a portion of the elongate shaft disposed within the housing chamber, the housing configured to translate relative to the elongate shaft to control positioning of a variable-geometry element associated with an aircraft. The hydraulic actuator includes a first piston disposed on the elongate shaft within the housing chamber, a second piston moveably disposed on the elongate shaft within the housing chamber, and a third piston moveably disposed on the elongate shaft within the housing chamber. At least one of the second piston and the third piston is operable to translate along the elongated shaft between (i) a first position relative to the first piston when a fluid provided to the housing by a first pressurized fluid source has a pressure that is greater than a pressure of a fluid provided to the housing by a second pressurized fluid source and (ii) a second position relative to the first piston when the fluid provided to the housing by the first pressurized fluid source has a pressure that is less than the pressure of the fluid provided to the housing by the second pressurized fluid source.

In one arrangement, a servovalve includes a first servovalve assembly having a first housing defining a first fluid pathway, a second servovalve having a second housing defining a second fluid pathway, and a hydraulic actuator in fluid communication with the first servovalve assembly and the second servovalve assembly. The hydraulic actuator includes an elongate shaft and a housing defining a housing chamber at least a portion of the elongate shaft disposed within the housing chamber, the housing configured to translate relative to the elongate shaft to control positioning of a variable-geometry element associated with an aircraft. The hydraulic actuator includes a first piston disposed on the elongate shaft within the housing chamber, a second piston moveably disposed on the elongate shaft within the housing chamber, and a third piston moveably disposed on the elongate shaft within the housing chamber. At least one of the second piston and the third piston is operable to translate along the elongated shaft between (i) a first position relative to the first piston when a fluid provided to the housing by the first servovalve assembly has a pressure that is greater than a pressure of a fluid provided to the housing by the second servovalve assembly and (ii) a second position relative to the first piston when the fluid provided to the housing by the first servovalve assembly has a pressure that is less than the pressure of the fluid provided to the housing by the second servovalve assembly.

In one arrangement, a hydraulic actuator system includes a first pressurized fluid source, a second pressurized fluid source, a first servovalve assembly having a first housing defining a first fluid pathway, the first servovalve assembly disposed in fluid communication with the first pressurized fluid source, and a second servovalve having a second housing defining a second fluid pathway the second servovalve assembly disposed in fluid communication with the second pressurized fluid source. The hydraulic actuator system includes a hydraulic actuator in fluid communication with the first servovalve assembly and the second servovalve assembly. The hydraulic actuator includes an elongate shaft, a housing defining a housing chamber at least a portion of the elongate shaft disposed within the housing chamber, the housing being configured to translate relative to the elongate shaft to control positioning of a variable-geometry element associated with an aircraft. The hydraulic actuator includes a first piston disposed on the elongate shaft within the housing chamber, a second piston moveably disposed on the elongate shaft within the housing chamber, and a third piston moveably disposed on the elongate shaft within the housing chamber. At least one of the second piston and the third piston is operable to translate along the elongated shaft between (i) a first position relative to the first piston when a fluid provided to the housing by the first pressurized fluid source via the first servovalve assembly has a pressure that is greater than a pressure of a fluid provided by the second pressurized fluid source to the housing via the second servovalve assembly and (ii) a second position relative to the first piston when the fluid provided to the housing by the first pressurized fluid source via the first servovalve assembly has a pressure that is less than a pressure of the fluid provided by the second pressurized fluid source to the housing via the second servovalve assembly.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Embodiments of the present invention relate to a hydraulic actuator that provides redundant boost control to an aircraft within approximately the same space required by a single hydraulic cylinder. The hydraulic actuator includes a housing and a piston assembly disposed within the housing. The piston assembly includes a ram, a first piston secured to the ram, and second and third pistons disposed on the ram such that the second and third pistons are translatable relative to the longitudinal axis of the ram. The pistons form two hydraulically separate actuator cylinders. Such a configuration results in a reduction in the weight and size of the hydraulic actuator and provides fail safe redundancy in the event of failure of either hydraulic system associated with the hydraulic actuator by automatically switching between a first, non-functional hydraulic actuator and a second functional hydraulic actuator. The hydraulic actuator does not incur viscous damping losses in the event of failure of one hydraulic system when the other hydraulic system is actively operating. Accordingly, the present hydraulic actuator does not require the use of a switching valve. The configuration of the hydraulic actuator also allows the hydraulic actuator to provide only the output load required to actuate a variable-geometry element, as opposed to double the output load as required in conventional dual actuators. In other words, in use, the hydraulic actuator produces the same output force whether both hydraulic system are pressurized or only a single hydraulic system is pressurized. Accordingly, the present configuration of the hydraulic actuator allows for lighter weight aircraft structure and linkage hardware, thereby providing optimal sizing for an aircraft.

Figure 3:
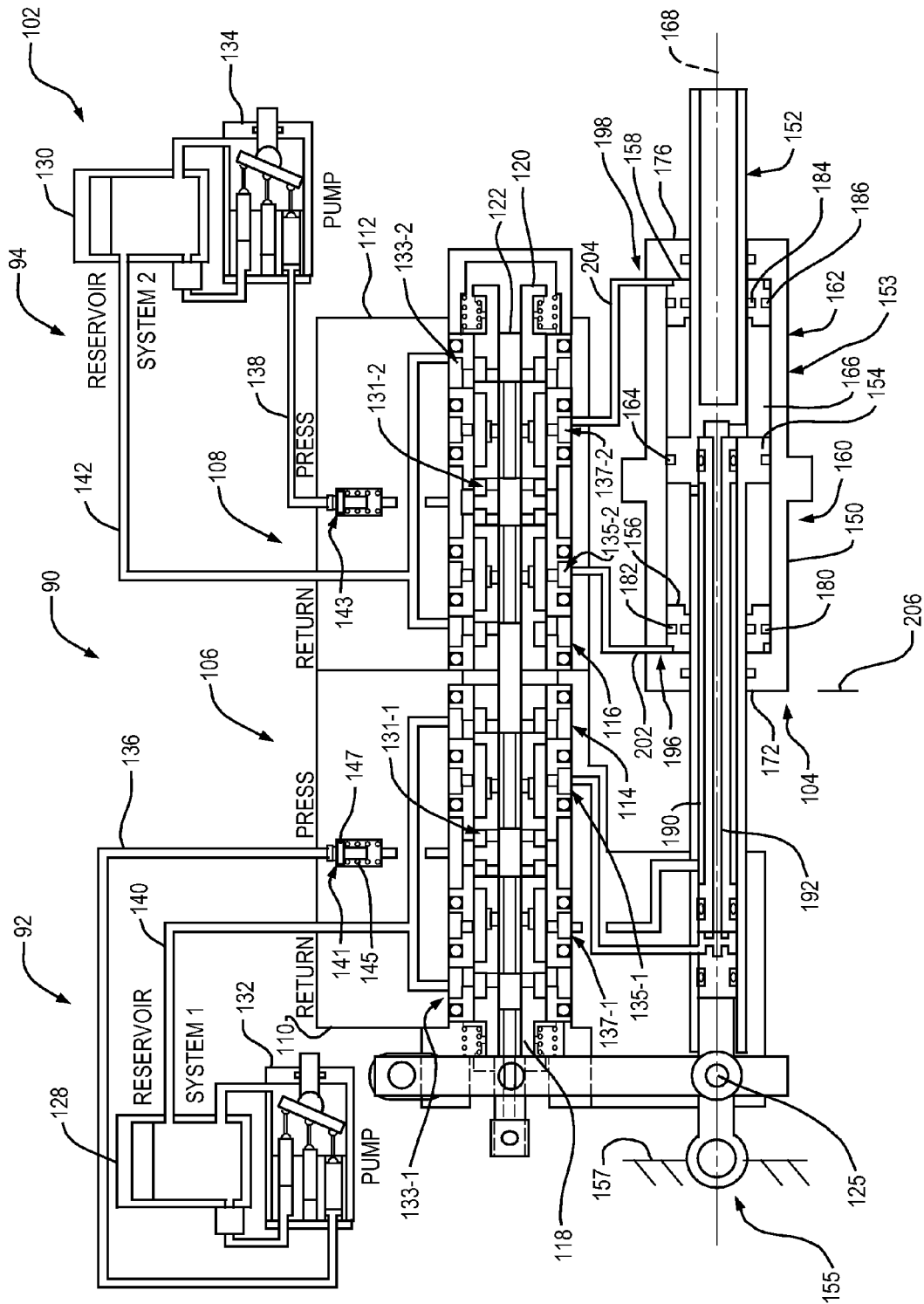
FIG. 3 illustrates a hydraulic actuator system having a single hydraulic cylinder with two translatable pistons.

FIGS. 3-7 illustrate an arrangement of a hydraulic actuator system 90 according to an embodiment of the invention. With reference to FIG. 3 for convenience, the hydraulic actuator system 90 includes a first actuator subsystem 92, a second actuator subsystem 94, and a hydraulic actuator 104 configured to operate a variable-geometry element, such as a rotor associated with a helicopter or a flight control surface associated with an aircraft.

Each of the first and second actuator subsystems 92, 94 includes first and second fluid reservoirs 128, 130, respectively, along with corresponding first and second pumps 132, 134. Collectively, the first fluid reservoir 128 and the first pump 132 define a first pressurized fluid source while the second fluid reservoir 130 and second pump 134 define a second pressurized fluid source. Each pump 132, 134 is configured to deliver fluid from the corresponding fluid reservoir 128, 130 to a corresponding servovalve assembly 106, 108. For example, the first fluid reservoir 128 includes a transmission line or conduit 136 for delivery of fluid to the servovalve assembly 106 via first pump 132 while the second fluid reservoir 130 includes a transmission line or conduit 138 for delivery of fluid to the servovalve assembly 108 via second pump 134. Each pump 132, 134 is also configured to provide fluid from the servovalve assemblies 106, 108 to the corresponding reservoirs 128, 130 via return lines or conduits 140, 142. For example, the first fluid reservoir 128 includes a return line 140 for receipt of fluid from the servovalve assembly 106 via pump 132 while the second fluid reservoir 130 includes a return line 142 for receipt of fluid from the servovalve assembly 108 via pump 134.

As indicated above, each of the first and second actuator subsystems 92, 94 includes a respective first and second servovalve assembly 106, 108, to provide redundant control of the hydraulic actuator 104 during operation. Each servovalve assembly 106, 108 has a respective housing 110, 112 where each housing 110, 112 defines a respective fluid pathway 114, 116. Each housing 110, 112 also includes a corresponding sleeve 118, 120 and a valve member 122, such as a spool, disposed within the corresponding fluid pathways 114, 116. Each sleeve 118, 120 defines a set of ports for fluid coupling of each servovalve assembly 106, 108, to the corresponding fluid reservoir 128, 130. For example, the first sleeve 118 defines a set of transmission ports 131-1, disposed in fluid communication with a directional check valve 141 and the transmission line 136. The directional check valve 141, in one arrangement includes a spring 145 configured to bias a valve member 147 in a position, as shown, to allow the flow of fluid along the transmission line 136 from the first reservoir 128 to the hydraulic actuator 104 and minimizes or prevents the flow of fluid from the hydraulic actuator 104 to the first reservoir 128 via the transmission line 136. The first sleeve 118 also defines a set of return ports 133-1 disposed in fluid communication with the return line 140.

The second sleeve 120 defines a set of transmission ports 131-2 disposed in fluid communication with a directional check valve 143 and the transmission line 138. The directional check valve 143 allows the flow of fluid along the transmission line 138 from the second fluid reservoir 130 to the hydraulic actuator 104 and minimizes or prevents the flow of fluid from the hydraulic actuator 104 to the second fluid reservoir 130 via the transmission line 138. The second sleeve 120 further defines a set of return ports 133-2 disposed in fluid communication with the return line 142. Additionally, each sleeve 118, 120 defines a set of ports for fluid coupling of each servovalve assembly 106, 108, to the hydraulic actuator 104. For example, the first sleeve 118 defines a first actuator port 135-1 and a second actuator port 137-1 disposed in fluid communication with the hydraulic actuator 104 while the second sleeve 120 defines a first actuator port 135-2 and a second actuator port 137-2 also disposed in fluid communication with the hydraulic actuator 104.

The valve member 122 is configured to meter an amount of fluid flowing through the corresponding servovalve assemblies 106, 108 from the pumps 132, 134 and fluid reservoirs 128, 130 to the hydraulic actuator 104. For example, the valve member 122 is secured at one end to an actuator 125. Movement of the actuator 125 by an operator causes the valve member 122 to translate longitudinally within the fluid pathways 114, 116 in order to control porting of the fluid between the first and second sets of transmission and return ports 131, 133 and the first and second sets of actuator ports 135, 137, thereby controlling the hydraulic actuator 104.

The hydraulic actuator 104 includes a housing 150 secured to a variable-geometry element, such as a rotor, and an elongate shaft or ram 152 extending through a chamber 153 defined by the housing 150. In use, the housing 150 of the hydraulic actuator 104 is configured to translate relative to a longitudinal axis 168 of the ram 152 in response to actuation of the valve member 122.

The hydraulic actuator 104 includes pistons that divide the chamber 153 into separate sections or chamber portions. For example, as illustrated, the hydraulic actuator 104 includes a first piston 154, a second or retract piston 156, and a third or extend piston 158 disposed within the housing 150. The first piston 154 is secured to the ram 152 and defines a first chamber portion 160 within the housing 150 relative to the second piston 156 and defines a second chamber portion 162 within the housing 150 relative to the third piston 158. Collectively, the first and second chamber portions define a first actuator volume. In one arrangement, the first piston 154 includes a sealing element 164, such as an O-ring, disposed between the first piston 154 and an inner wall 166 of the housing 150. The sealing element 164 minimizes the flow of fluid between the first and second chambers 160, 162 during operation in order to maintain adequate fluid pressure within the chambers 160, 162.

Figure 6:
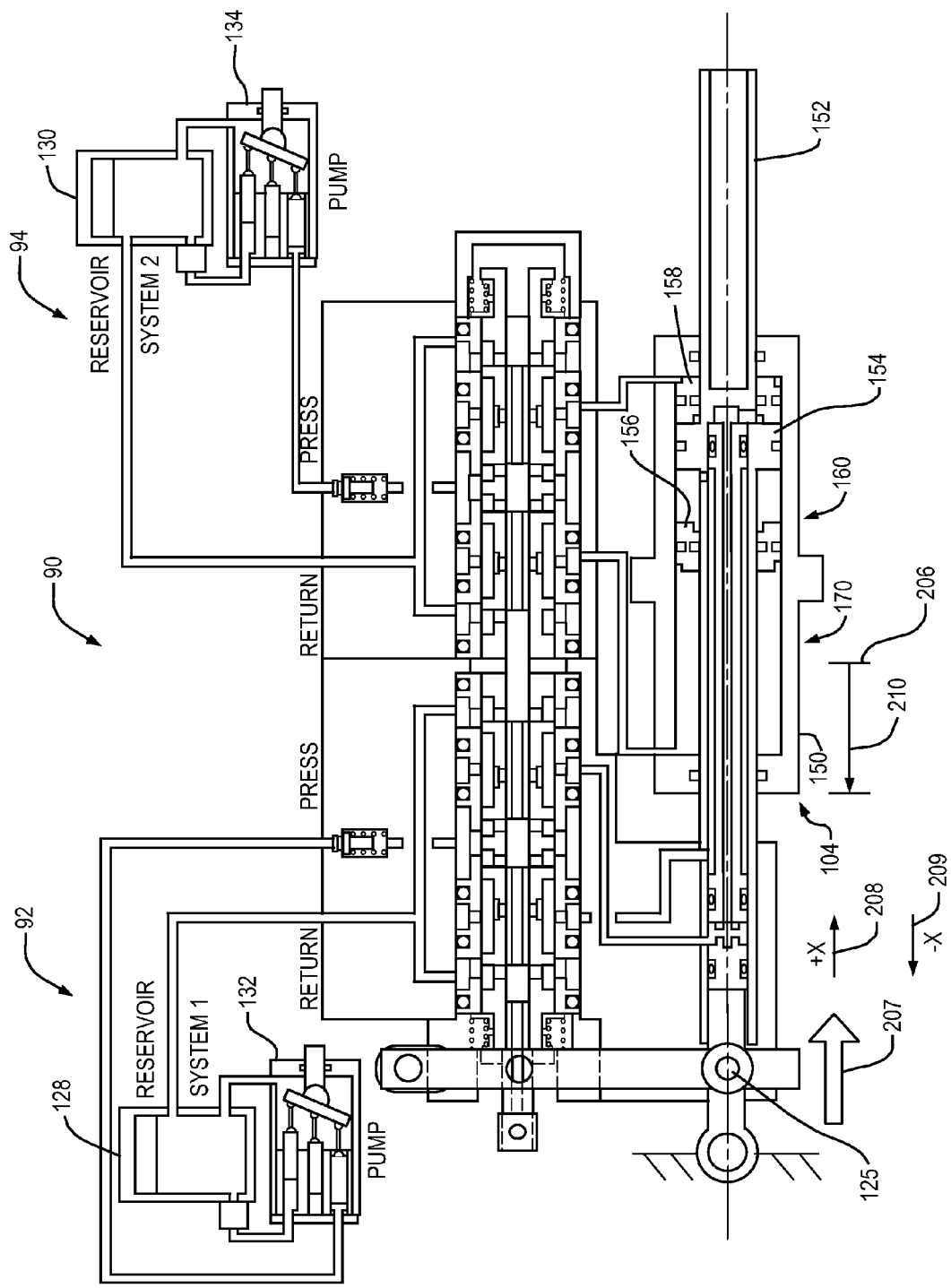
FIG. 6 illustrates the hydraulic actuator system of FIG. 5 showing further movement of the first translatable piston in the hydraulic cylinder in response to pressure loss in the first system and in response to the retract command.
Figure 7:
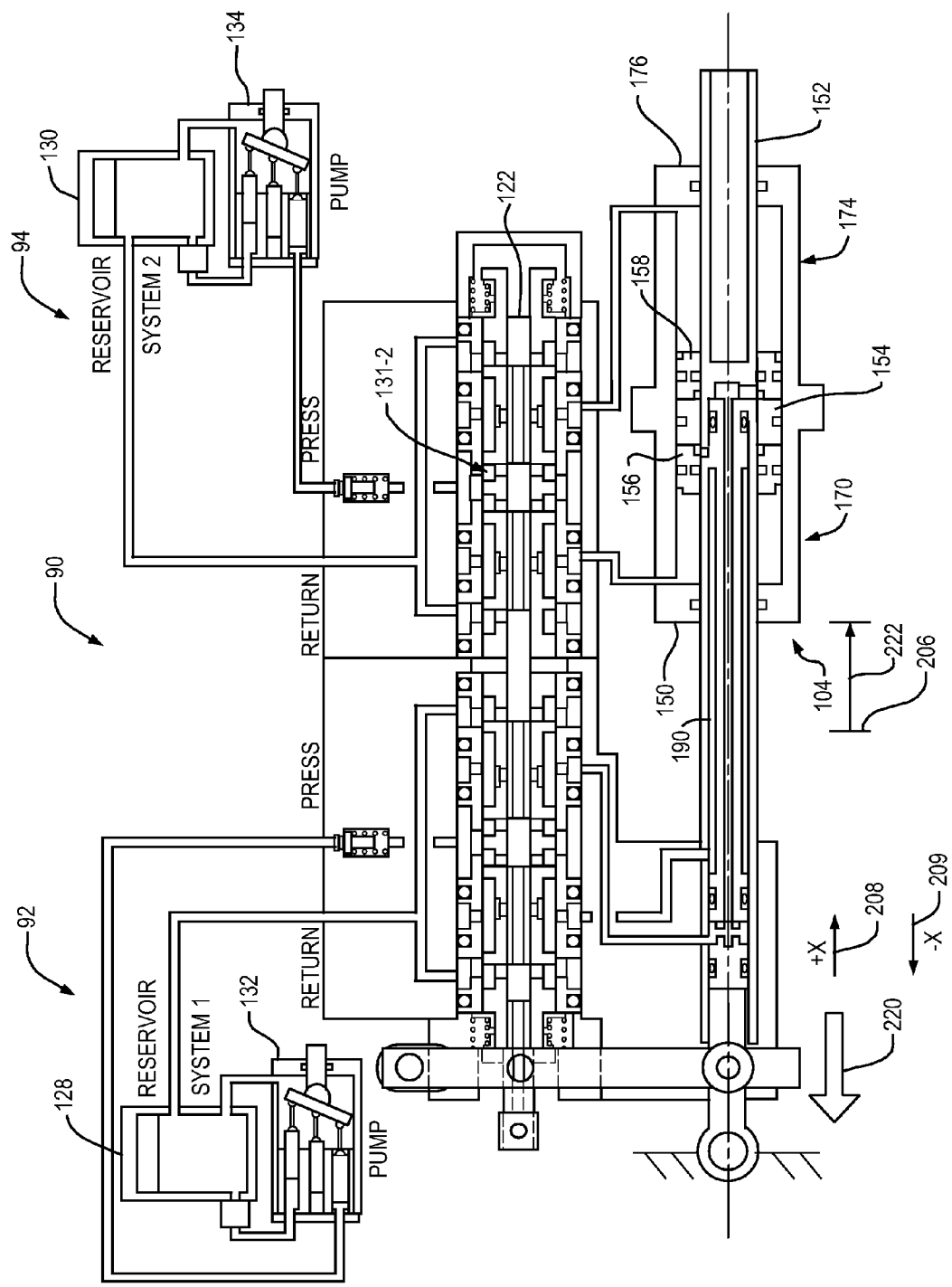
FIG. 7 illustrates the hydraulic actuator system of FIG. 6 showing movement of a second floating piston in the hydraulic cylinder, relative to the ram, in response to pressure loss in the first system and in response to an extend command.

The second and third pistons 156, 158 are moveably disposed on the ram 152. For example, as will be described in detail below, the second and third pistons 156, 158 are configured to translate along a longitudinal axis 168 of the ram 152, such as caused by a failure of the first actuator subsystem 92. As best illustrated in FIG. 6, the second piston 156 defines a third chamber portion 160 within the housing 150 relative to a first end wall 172 of the housing 104. Additionally, as best illustrated in FIG. 7, the third piston 158 defines a fourth chamber portion 174 relative to a second end wall 176 of the housing 150. Collectively, the third and fourth chamber portions define a second actuator volume.

Returning to FIG. 3, while the second and third pistons 156, 158 are moveably disposed on the ram 152, the pistons 156, 158 include sealing elements to minimize the flow of fluid into or out of the respective third and fourth chamber portions 170, 174. For example, the second piston 156 includes a first sealing element 180, such as an O-ring, disposed between the ram 152 and the second piston 156 and a second sealing element 182, such as an O-ring, disposed between the second piston 156 and the inner wall 166 of the housing 150. Also, the third piston 158 includes a first sealing element 184, such as an O-ring, disposed between the ram 152 and the third piston 158 and a second sealing element 186, such as an O-ring, disposed between third piston 158 and the inner wall 166 of the housing 150.

As indicated above, the hydraulic actuator 104 is fluidly coupled to the fluid reservoirs 128, 130 via the servovalve assemblies 106, 108. While the first servovalve assembly 106 can provide pressurized fluid to the first and second chamber portions 160, 162 of the housing 150 in a variety of ways, in one arrangement, the first servovalve assembly 106 provides pressurized fluid to and from the first and second chamber portions 160, 162 through the ram 152. For example, as illustrated in FIG. 3 the ram 152 defines a first channel 190 disposed about an outer circumference portion of the ram 152 and disposed in fluid communication with the first chamber portion 160 an with the first actuator port 135-1. The ram 152 also defines a second channel 192 disposed within the ram 152 along the longitudinal axis 168 and disposed in fluid communication with the second chamber portion 162 of the housing 150 and in fluid communication with the second actuator port 137-1.

Additionally, while the second servovalve assembly 108 can provide pressurized fluid to the third and fourth chamber portions 170, 174 of the housing 150 in a variety of ways, in one arrangement, the second servovalve assembly 108 provides pressurized fluid to and from the third and fourth chamber portions 170, 174 through ports 196, 198 disposed between the second and third pistons 156, 158 and the end walls 172, 176, respectively. For example, the first port 196 is disposed in fluid communication with the first actuator port 135-2 of the sleeve 120 of the second servovalve assembly 108 via a first compliant or flexible channel 202 while the second port 198 is disposed in fluid communication with the second actuator port 137-2 of the sleeve 120 of the second servovalve assembly 108 via a second compliant channel 204.

In the arrangement shown in FIG. 3, the servovalve assemblies 106, 108 and the hydraulic actuator 104 are disposed in a null position. With such positioning, fluid pressure within the first chamber 160 of the hydraulic actuator 104 is substantially equal to fluid pressure within the second chamber 162, as provided by the first fluid reservoir 128 and pump 132 through the first servovalve assembly 106. Additionally, the pressure of the fluid provided to the third and fourth chamber portions 170, 174 by the second fluid reservoir 130 through the second servovalve assembly 108 is less than the pressure of the fluid contained in the first and second chambers 160, 162. Under normal operation, this pressure differential, along with a frictional force between the sealing members 182, 186 and the inner wall 166 of the housing 150 maintains the second and third pistons 156, 158 in a position in proximity to the end walls 172, 176, respectively. Accordingly, under normal operating conditions, when the servovalve assemblies 106, 108 are disposed in a null position, the housing 150 is disposed at a null or starting position referenced, by way of example only, by marker 206.

During standard or normal operation (i.e., when both the first and second actuator subsystems 92, 94 are functional), the either the first actuator subsystem 92 fluidically powers the hydraulic actuator 104 while the second actuator subsystem 94 provides stand-by boost pressure to the hydraulic actuator 104 in the event of a failure of one or more components of the first actuator subsystem 92 or vice versa. Accordingly, during standard operation, an operator can provide either a retract command or an extend command to the hydraulic actuator system 90 to operate a variable-geometry element, such as a helicopter's rotor.

Figure 4:
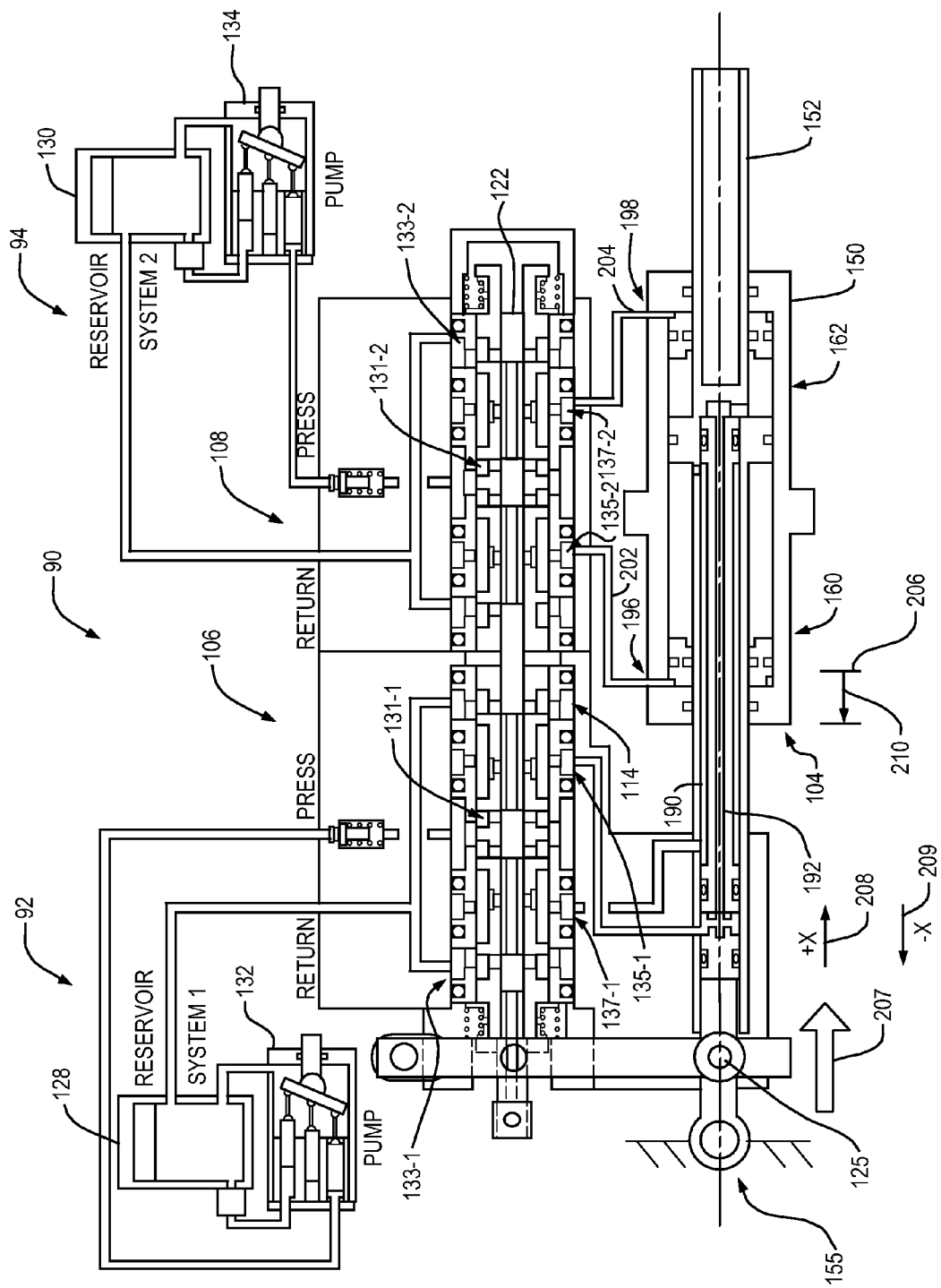
FIG. 4 illustrates the hydraulic actuator system of FIG. 3 showing movement of the hydraulic cylinder in response to a retract command.

FIG. 4 illustrates the response of the hydraulic actuator 104 during normal operation when an operator provides a retract command to the hydraulic actuator system 90. For example, in use, an operator provides a retract command 207 to the hydraulic actuator system 90 by rotating the actuator 125 along a +X direction 208 thereby causing the valve member 122 to translate longitudinally within the fluid pathways 114, 116 along the +X direction 208. With respect to the first actuator subsystem 92, translation of the valve member 122 ports relatively high pressure fluid received from the reservoir 128 via the transmission port 131-1 to the first chamber portion 160 of the hydraulic actuator 104 via the second actuator port 137-1 and the first channel 190 of the ram 152. Also with respect to the first actuator subsystem 92, translation of the valve member 122 ports fluid contained within the second chamber portion 162 of the hydraulic actuator 104 to the return port 133-1 via the second channel 192 of the ram 152 and the first actuator port 137-1. Furthermore, as the operator provides the retract command 207 to the hydraulic actuator system 90, with respect to the second actuator subsystem 94, translation of the valve member 122 along the +X direction 208 ports relatively high pressure fluid received from the reservoir 130 via the transmission port 131-2 to the third chamber portion 170 of the hydraulic actuator 104 via the first port 135-2 and the flexible channel 202. Also with respect to the second actuator subsystem 94, translation of the valve member 122 along the +X direction 208 ports fluid contained within the fourth chamber portion 174 of the hydraulic actuator 104 to the return ports 133-2 via the second actuator port 137-2 and the flexible channel 204.

As indicated above, under normal operating conditions, the fluid pressure of the first actuator subsystem 92 is greater than the fluid pressure of the second actuator subsystem 94. Therefore, in use, the fluid pressure in both the first and second chamber portions 160, 162 is greater than the fluid pressure within the third and fourth chamber portions 170, 174. Accordingly, the fluid pressure in the first and second chamber portions 160, 162 help to maintain the second and third pistons 155, 158 against the first and second end walls 172, 176 (i.e., end glands) of the hydraulic actuator 104 during operation. Furthermore under normal operating conditions, the first actuator subsystem 92 drives the hydraulic actuator 104. For example, the increase in fluid pressure the first chamber portion 160 and the decrease in fluid pressure in the second chamber portion 162 causes the hydraulic actuator 104 to translate along direction 210 (i.e., along a –X direction 209) relative to starting position 206 and the ram 152, thereby operating a variable-geometry element, such as a rotor or a flight control surface for example. The second actuator subsystem 94 (i.e., the second fluid reservoir 130, the second pump 134, and the second servovalve assembly 108) provides stand by boost pressure to the hydraulic actuator 104 in the event of failure of one or more components of the first actuator subsystem 92.

Figure 5:
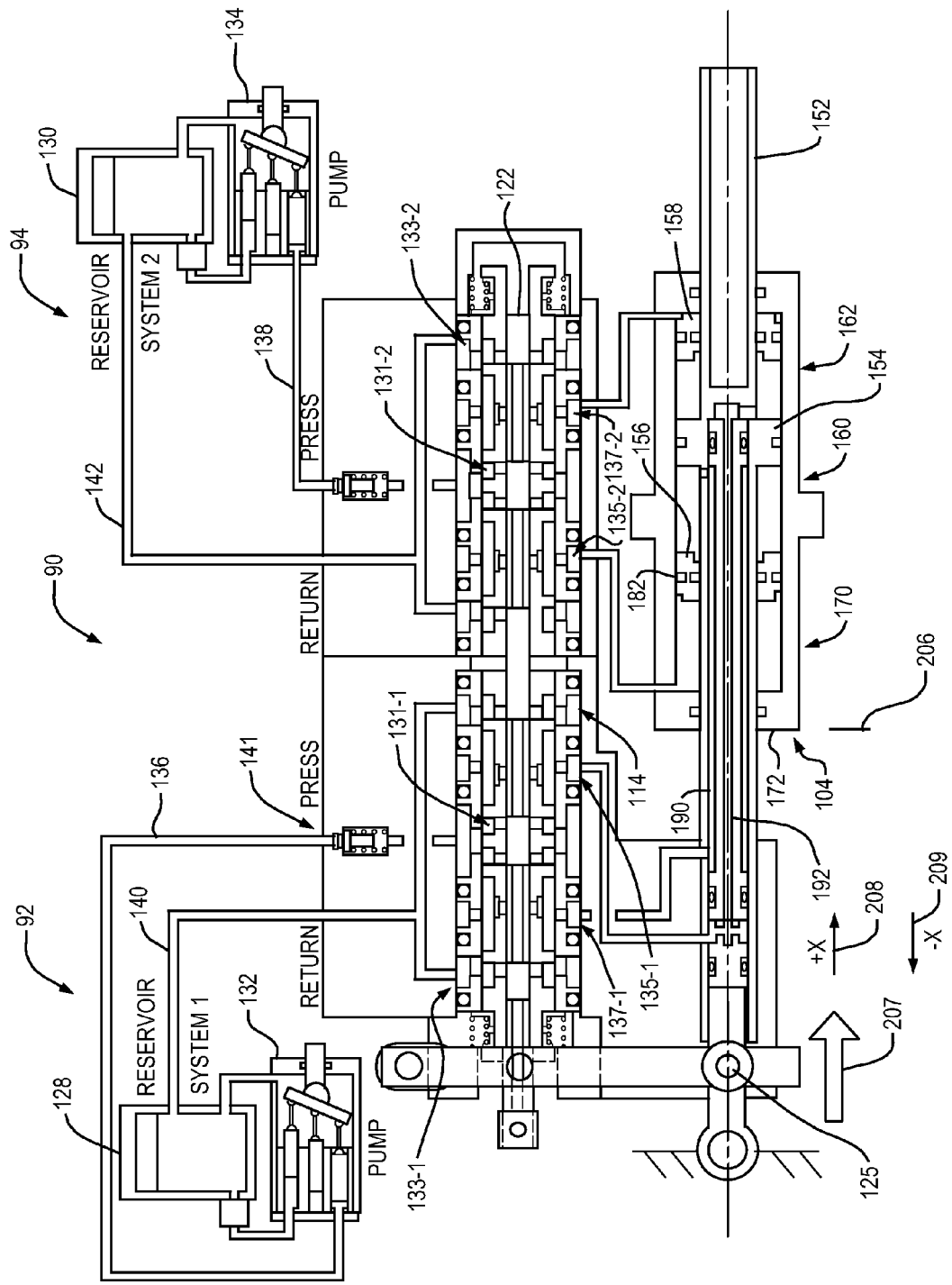
FIG. 5 illustrates the hydraulic actuator system of FIG. 3 showing movement of a first translatable piston in the hydraulic cylinder, relative to a ram, in response to pressure loss in the first system and in response to a retract command.

With reference to FIG. 3, in the event that one or more components of the first actuator subsystem 92 become inoperable, such as by failure of the pump 132 or as caused by a leak in the transmission lines 136, 140, the second servovalve assembly 108 is configured to control operation of the hydraulic actuator 104 via the second and third pistons 156, 158. FIGS. 5-7 illustrate transition of control of the hydraulic actuator 104 from the first actuator subsystem 92 to the second actuator subsystem 94. As will be described below, full transition of control of the hydraulic actuator 104 from the first actuator subsystem 92 to the second actuator subsystem 94 is not immediate. For example, fluid originating from the first actuator subsystem 92 and remaining within the first and second chamber portions 160, 162 within the hydraulic actuator 104 is progressively forced out of the hydraulic actuator 104 as the hydraulic actuator 104 is cycled between a retracted position and extended position. In one arrangement, full transition of control from the first actuator subsystem 92 to the second actuator subsystem 94 is completed by a single retract stroke of the actuator 125 followed by a single extend stroke of the actuator 125. Because transition of control of the hydraulic actuator 104 from the first actuator subsystem 92 to the second actuator subsystem 94 is progressive, transient effects of the transition are negligible and, therefore, transparent to an operator.

FIG. 5 illustrates the hydraulic actuator system 90 in the case where the first actuator subsystem 92 experiences a loss in pressure such that the fluid pressure of the first actuator subsystem 92 drops below the fluid pressure of the second actuator subsystem 94. As an operator provides the retract command 207 to the hydraulic actuator system 90, with respect to the second actuator subsystem 92, the valve member 122 ports relatively high pressure fluid from the second fluid reservoir 130 via the transmission port 131-2 to the third chamber portion 170 of the hydraulic actuator. Furthermore, with respect to the first actuator subsystem 92, as the operator provides the retract command 207, translation of the valve member 122 ports fluid contained within the second chamber portion 162 of the hydraulic actuator 104 to the first reservoir 128 via the second channel 192 of the ram 152. Regarding the fluid contained in the first chamber portion 160, the directional check valve 141 operates to seal the first channel 190 of the ram 152 in order to minimize or prevent flow of the fluid from the first chamber portion 160 in order to support the externally applied load as the hydraulic actuator 104 retracts.

As indicated in FIG. 6, as the operator provides the retract command 207 to the hydraulic actuator system 90, pressurized fluid flows into the third chamber portion 170. With the increase in pressure in the third chamber portion 170, the pressure overcomes frictional force created by the seal 182 on second piston 156 and the second piston 156 translates along the longitudinal axis of the ram 152. The fluid contained in the first chamber portion 160 supports the load generated by the second piston 156 and distributes the load to the first piston 154. Accordingly, in response, the hydraulic actuator housing 150 translates along direction 210 (i.e., along a –X direction 209) relative to starting position 206 and the ram 152 to adjust the position of a variable-geometry element, such as a rotor or a flight control surface. Simultaneously during retraction, as indicated in FIG. 6, in response to the translation of the housing 150, the first piston 154 causes the fluid contained within the second chamber portion 162 to be evacuated to the first fluid reservoir 128. The fluid flows from the second chamber 162 to the first fluid reservoir 128 until the first piston 154 contacts the second piston 156, as shown in FIG. 6.

FIG. 7 illustrates further operation of the hydraulic actuator system 90 after the first actuator subsystem 92 has experienced the loss in pressure. In use, the operator provides an extend command 220 to the hydraulic actuator system 90. As the operator provides the extend command 220 to the hydraulic actuator system 90, with respect to the second actuator subsystem 92, the valve member 122 ports relatively high pressure fluid from the second fluid reservoir 130 via the transmission port 131-2 to the fourth chamber portion 174 of the hydraulic actuator and ports fluid contained within the third chamber portion 170 to the second fluid reservoir 130. Furthermore, with respect to the first actuator subsystem 92, as the operator provides the extend command 220, translation of the valve member 122 ports fluid contained within the first chamber portion 160 to the first fluid reservoir 128 via the first channel of the ram 190.

As indicated in FIG. 7, as pressurized fluid flows into the fourth chamber portion 174, the increase in pressure in the third chamber portion 170 overcomes the frictional force created by the seal 186 on third piston 158 and the third piston 158 translates along the longitudinal axis of the ram 152. Such translation of the third piston 158 causes the fluid contained within the second chamber portion 162 to flow into the first fluid reservoir 128. The translation of the third piston 158 also causes the third piston 158 to generate a load against the first piston 154 via the fluid contained within the second chamber 162. Because the first piston 154 is secured to the ram 152, in response to the increased pressure within the fourth chamber 174, the hydraulic actuator housing 150 translates along direction 222 (i.e., along a ±X direction 208) relative to starting position 206 and the ram 152 along direction 210 to adjust the position of a variable-geometry element, such as a rotor.

As the third piston 158 causes the fluid contained within the second chamber 162 to be evacuated from the second chamber 162, the third piston 158 translates along the longitudinal axis of the ram 152 until the third piston 158 contacts the first piston 154. At this point, further translation of the third piston 158 along the longitudinal axis of the ram 152 generates a load against the first piston 154 and causes further translation of the housing 150 relative to the ram 152. With both the second and third floating pistons 156, 158 disposed in proximity to the first piston 154, transition from operation of the hydraulic actuator 104 from the first actuator subsystem 92 to the second actuator subsystem 94 is considered complete. Accordingly, as illustrated in FIG. 7, the second actuator subsystem fully controls the hydraulic actuator 104.

Figure 1:
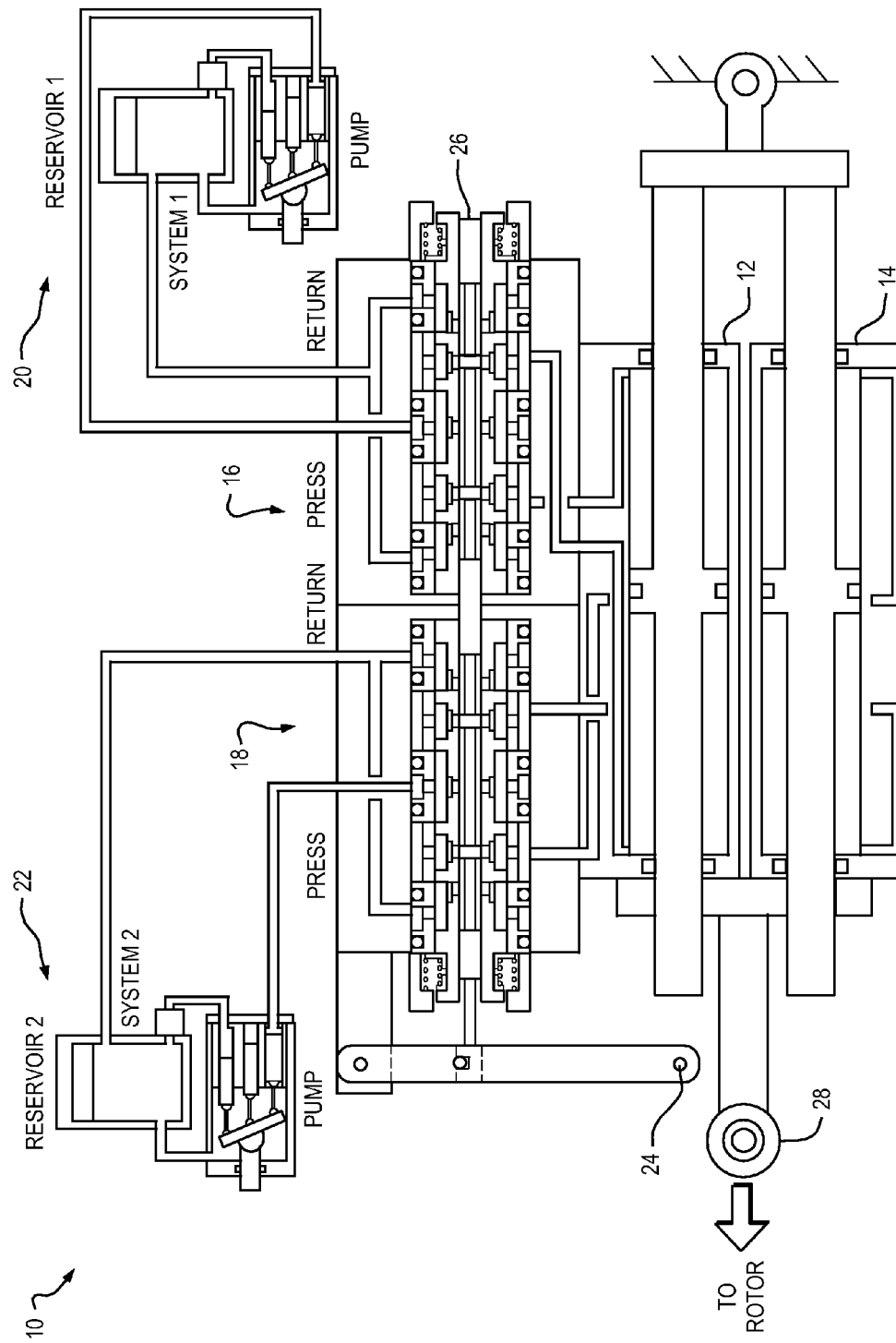
FIG. 1 illustrates a prior art hydraulic actuator system having dual hydraulic cylinders with dual hydraulic systems.
Figure 2:
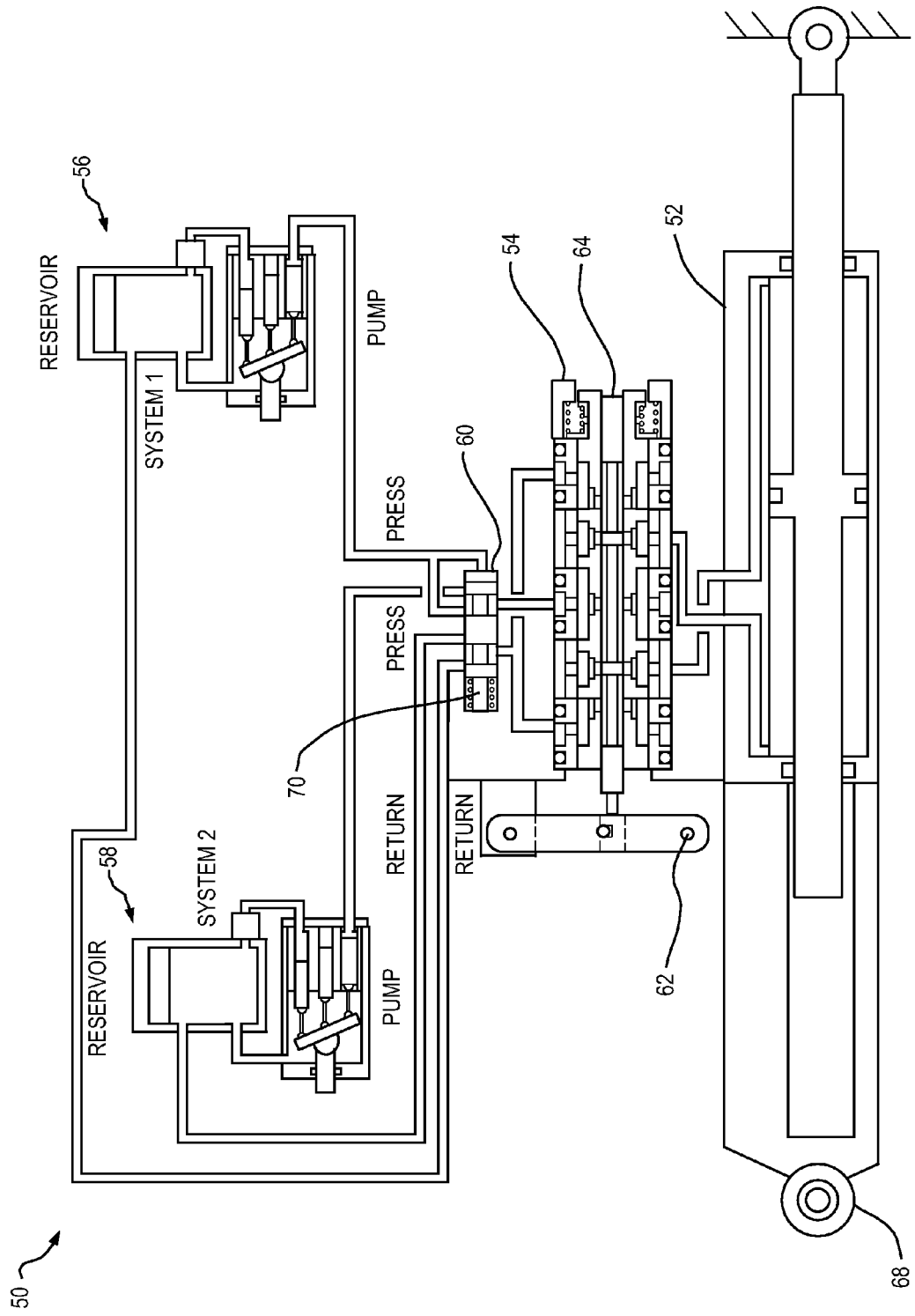
FIG. 2 illustrates a prior art hydraulic actuator system having a single hydraulic cylinder and a switching valve disposed between dual hydraulic systems.

The use of the fixed first piston 154 and the moveable second and third pistons 156, 158 as part of the hydraulic actuator 104 creates two separate hydraulic actuator cylinders within the space of a single hydraulic actuator cylinder. For example, the first piston 154, the first chamber portion 160 formed between the first piston 154 and the second piston 156, and the second chamber portion 164 formed between the first piston 154 and the third piston 158 define a first hydraulic cylinder. Additionally, the combination of second piston 156 and the third chamber portion 170 formed between the second piston and the end wall 172 as well as the third piston 158 and the fourth chamber portion 174 formed between the third piston 158 and the second end wall 176 define a second hydraulic cylinder. Such a configuration of the hydraulic actuator 104 reduces the size and weight of the hydraulic actuator 104 compared to conventional hydraulic cylinders (e.g., as illustrated in FIG. 1). Additionally, the moveable second and third pistons 156, 158 allows a relatively smooth transition of control of the hydraulic actuator from the first actuator subsystem 92 to the second actuator subsystem 94 to maintain user control of the hydraulic actuator 104, and an associated variable-geometry element, when a portion of the first actuator subsystem becomes inoperable. Also, the configuration of the hydraulic actuator allows the hydraulic actuator to provide only the output load required to actuate a variable-geometry element, as opposed to double the output load as required in conventional dual actuators. Accordingly, the present configuration of the hydraulic actuator allows for lighter weight aircraft structure and linkage hardware, thereby providing optimal sizing for an aircraft.

While various embodiments of the invention have been particularly shown and described, it will be understood by those skilled in the art that various changes in form and details may be made therein without departing from the spirit and scope of the invention as defined by the appended claims.

For example, as described above, FIG. 4 illustrates the response of the hydraulic actuator 104 during normal operation when an operator provides a retract command 207 to the hydraulic actuator system 90. While the retract command is described and shown in FIG. 4, one of ordinary skill in the art will understand that, during operation, the operator can also provide an extend command (e.g., opposing the retract command 207) to the hydraulic actuator system 90 to position the hydraulic actuator housing 152 in an extended position.

In another example, as described above, in the case where the first actuator subsystem 92 becomes inoperable, full transition of control from the first actuator subsystem 92 to the second actuator subsystem 94 is completed by a single retract stroke of the actuator 125 followed by a single extend stroke of the actuator 125. Such description is by way of example only. In one arrangement, during operation, an operator provides a series of relatively short extend and retract commands to the hydraulic actuator system 90 to transition control of the hydraulic actuator 104 from first actuator subsystem 92 to the second actuator subsystem 94. While the operator can provided the extend and retract commands to the hydraulic actuator system 90 in alternating sequence, one of ordinary skill in the art will understand that the user can provide the extend and retract commands to the hydraulic actuator system 90 in any sequence.

As indicated above with respect to FIGS. 3-7, in use, the housing 150 of the hydraulic actuator 104 is configured to translate relative to a longitudinal axis 168 of the ram 152 in response to actuation of the valve member 122. Accordingly, as illustrated, at least one end 155 of the ram 152 is secured to a housing portion 157 of the aircraft while the housing 150 is allowed to translate relative to a longitudinal axis of the ram 152. Such illustration is by way of example only. In one arrangement, the housing 150 can be either mounted on the ram 152 with the cylinder operable to translate back and forth along the longitudinal axis 168 or the housing 150 can be integrally formed with the cylinder and translate with the ram 152 being grounded. Both arrangements utilize flexible couplings 202, 204 between the cylinder and control valve housings.

What is claimed is:

1. A hydraulic actuator, comprising:
   an elongate shaft;
   a housing defining a housing chamber at least a portion of the elongate shaft disposed within the housing chamber, the housing configured to translate relative to the elongate shaft to control positioning of a variable-geometry element associated with an aircraft;
   a first piston disposed on the elongate shaft within the housing chamber;
   a second piston moveably disposed on the elongate shaft within the housing chamber;
   a third piston moveably disposed on the elongate shaft within the housing chamber;
   at least one of the second piston and the third piston being operable to translate along the elongated shaft between (i) a first position relative to the first piston when a fluid provided to the housing by a first pressurized fluid source has a pressure that is greater than a pressure of a fluid provided to the housing by a second pressurized fluid source and (ii) a second position relative to the first piston when the fluid provided to the housing by the first pressurized fluid source has a pressure that is less than the pressure of the fluid provided to the housing by the second pressurized fluid source;
   the second piston is moveably disposed on the elongate shaft within the housing between the first piston and a first end wall of the housing; and
   the third piston is moveably disposed on the elongate shaft within the housing between the first piston and a second end wall of the housing, the second end wall opposing the first end wall;
   wherein a first actuator volume defined between the first piston and the second piston and between the first piston and the third piston is configured to fluidly communicate with the first pressure source;
   wherein a second actuator volume defined between the second piston and the first end wall of the hydraulic cylinder and between the third piston and the second end wall of the of the hydraulic cylinder is configured to fluidly communicate with the second pressure source; and
   wherein the elongate shaft defines a first channel configured to carry fluid between the first pressurized fluid source and a first chamber portion of the first actuator volume and defines a second channel configured to carry fluid between a second chamber portion of the first actuator volume and the first pressurized fluid source.

2. The hydraulic actuator of claim 1, comprising a first channel configured to carry fluid between the second pressurized fluid source and a third chamber portion of the second actuator volume and a second channel configured to carry fluid between the second pressurized fluid source and a fourth chamber portion of the second actuator volume.

3. The hydraulic actuator of claim 1, wherein the second piston comprises a seal disposed about an outer periphery of the second piston between the second piston and an inner wall of the housing.

4. The hydraulic actuator of claim 1, wherein the third piston comprises a seal disposed about an outer periphery of the third piston between the third piston and an inner wall of the housing.

5. A servovalve, comprising:
a first servovalve assembly having a first housing defining a first fluid pathway;
a second servovalve having a second housing defining a second fluid pathway; and
a hydraulic actuator in fluid communication with the first servovalve assembly and the second servovalve assembly, the hydraulic actuator having:
an elongate shaft;
a housing defining a housing chamber at least a portion of the elongate shaft disposed within the housing chamber, the housing configured to translate relative to the elongate shaft to control positioning of a variable-geometry element associated with an aircraft;
a first piston disposed on the elongate shaft within the housing chamber;
a second piston moveably disposed on the elongate shaft within the housing chamber; and
a third piston moveably disposed on the elongate shaft within the housing chamber;
at least one of the second piston and the third piston being operable to translate along the elongated shaft between (i) a first position relative to the first piston when a fluid provided to the housing by the first servovalve assembly has a pressure that is greater than a pressure of a fluid provided to the housing by the second servovalve assembly and (ii) a second position relative to the first piston when the fluid provided to the housing by the first servovalve assembly has a pressure that is less than the pressure of the fluid provided to the housing by the second servovalve assembly.

6. The servovalve of claim 5, wherein:
the second piston is moveably disposed on the elongate shaft within the housing between the first piston and a first end wall of the housing; and
a third piston moveably disposed on the elongate shaft within the housing between the first piston and a second end wall of the housing, the second end wall opposing the first end wall;
wherein a first actuator volume defined between the first piston and the second piston and between the first piston and the third piston is configured to fluidly communicate with the first servovalve assembly; and
wherein a second actuator volume defined between the second piston and the first end wall of the hydraulic cylinder and between the third piston and the second end wall of the of the hydraulic cylinder is configured to fluidly communicate with the second servovalve assembly.

7. The servovalve of claim 6, wherein the first servovalve assembly comprises a directional check valve disposed in fluid communication between the first actuator volume of the hydraulic actuator and a transmission line of a first pressurized fluid source, the directional check valve configured to be positioned between (i) a first position to allow the flow of fluid along the transmission line from the first pressurized fluid source to the first actuator volume of the hydraulic actuator and (ii) a second position that limits the flow of fluid from the first actuator volume of the hydraulic actuator to the first pressurized fluid source.

8. The servovalve of claim 7, wherein, the first actuator volume comprises a first chamber portion and a second chamber portion and wherein, when positioned in a second position, the directional check valve is configured to maintain a volume of fluid within at least one of the first chamber portion and the second chamber portion.

9. The servovalve of claim 6, wherein the second servovalve assembly comprises a directional check valve disposed in fluid communication between the second actuator volume of the hydraulic actuator and a transmission line of a second pressurized fluid source, the directional check valve configured to be positioned between (i) a first position to allow the flow of fluid along the transmission line from the second pressurized fluid source to the second actuator volume of the hydraulic actuator and (ii) a second position that limits the flow of fluid from the second actuator volume of the hydraulic actuator to the second pressurized fluid source.

10. The servovalve of claim 9, wherein, the second actuator volume comprises a third chamber portion and a fourth chamber portion and wherein, when positioned in a second position, the directional check valve is configured to maintain a volume of fluid within at least one of the third chamber portion and the fourth chamber portion.

11. The servovalve of claim 6, wherein the elongate shaft defines a first channel configured to carry fluid between the first servovalve assembly and a first chamber portion of the first actuator volume and defines a second channel configured to carry fluid between a second chamber portion of the first actuator volume and the first servovalve assembly.

12. The servovalve of claim 5, wherein the second piston comprises a seal disposed about an outer periphery of the second piston between the second piston and an inner wall of the housing.

13. The servovalve of claim 5, wherein the third piston comprises a seal disposed about an outer periphery of the third piston between the third piston and an inner wall of the housing.

14. A hydraulic actuator system, comprising:
a first pressurized fluid source;
a second pressurized fluid source;
a first servovalve assembly having a first housing defining a first fluid pathway, the first servovalve assembly in fluid communication with the first pressurized fluid source;
a second servovalve having a second housing defining a second fluid pathway the second servovalve assembly in fluid communication with the second pressurized fluid source; and
a hydraulic actuator in fluid communication with the first servovalve assembly and the second servovalve assembly, the hydraulic actuator having:
an elongate shaft;
a housing defining a housing chamber at least a portion of the elongate shaft disposed within the housing chamber, the housing configured to translate relative to the elongate shaft to control positioning of a variable-geometry element associated with an aircraft;
a first piston disposed on the elongate shaft within the housing chamber;
a second piston moveably disposed on the elongate shaft within the housing chamber; and
a third piston moveably disposed on the elongate shaft within the housing chamber;
at least one of the second piston and the third piston being operable to translate along the elongated shaft between (i) a first position relative to the first piston when a fluid provided to the housing by the first pressurized fluid source via the first servovalve assembly has a pressure that is greater than a pressure of a fluid provided by the second pressurized fluid source to the housing via the second servovalve assembly and (ii) a second position relative to the first piston when the fluid provided to the housing by the first pressurized fluid source via the first servovalve assembly has a pressure that is less than a pressure of the fluid provided by the second pressurized fluid source to the housing via the second servovalve assembly.

15. The hydraulic actuator system of claim 14, wherein:
the second piston is moveably disposed on the elongate shaft within the housing between the first piston and a first end wall of the housing; and
a third piston moveably disposed on the elongate shaft within the housing between the first piston and a second end wall of the housing, the second end wall opposing the first end wall;
wherein a first actuator volume defined between the first piston and the second piston and between the first piston and the third piston is configured to fluidly communicate with the first servovalve assembly; and
wherein a second actuator volume defined between the second piston and the first end wall of the hydraulic cylinder and between the third piston and the second end wall of the of the hydraulic cylinder is configured to fluidly communicate with the second servovalve assembly.

16. The hydraulic actuator system of claim 15, wherein the first servovalve assembly comprises a directional check valve disposed in fluid communication between the first actuator volume of the hydraulic actuator and a transmission line of a first pressurized fluid source, the directional check valve configured to be positioned between (i) a first position to allow the flow of fluid along the transmission line from the first pressurized fluid source to the first actuator volume of the hydraulic actuator and (ii) a second position that limits the flow of fluid from the first actuator volume of the hydraulic actuator to the first pressurized fluid source.

17. The hydraulic actuator system of claim 16, wherein, the first actuator volume comprises a first chamber portion and a second chamber portion and wherein, when positioned in a second position, the directional check valve is configured to maintain a volume of fluid within at least one of the first chamber portion and the second chamber portion.

18. The hydraulic actuator system of claim 15, wherein the second servovalve assembly comprises a directional check valve disposed in fluid communication between the second actuator volume of the hydraulic actuator and a transmission line of a second pressurized fluid source, the directional check valve configured to be positioned between (i) a first position to allow the flow of fluid along the transmission line from the second pressurized fluid source to the second actuator volume of the hydraulic actuator and (ii) a second position that limits the flow of fluid from the second actuator volume of the hydraulic actuator to the second pressurized fluid source.

19. The hydraulic actuator system of claim 18, wherein, the second actuator volume comprises a third chamber portion and a fourth chamber portion and wherein, when positioned in a second position, the directional check valve is configured to maintain a volume of fluid within at least one of the third chamber portion and the fourth chamber portion.

* * * * *